United States Patent
Ko (10) Patent No.: US 7,120,083 B2
(45) Date of Patent: Oct. 10, 2006

(54) STRUCTURE AND METHOD FOR TRANSFERRING COLUMN ADDRESS

(75) Inventor: Bok Rim Ko, Kyungki-Do (KR)

(73) Assignee: Hynix Semiconductor Inc., Kyungki-do (KR)

(*) Notice: Subject to any disclaimer, the term of this patent is extended or adjusted under 35 U.S.C. 154(b) by 115 days.

(21) Appl. No.: 10/741,017

(22) Filed: Dec. 19, 2003

(65) Prior Publication Data

US 2004/0233765 A1 Nov. 25, 2004

(30) Foreign Application Priority Data

May 23, 2003 (KR) .................... 10-2003-0033092

(51) Int. Cl.
*G11C 8/06* (2006.01)
*G11C 8/18* (2006.01)

(52) U.S. Cl. .............................. 365/230.08; 365/233
(58) Field of Classification Search .......... 365/230.08, 365/227, 233; 327/57, 155, 211, 212; 326/96
See application file for complete search history.

(56) References Cited

U.S. PATENT DOCUMENTS

| | | | | | |
|---|---|---|---|---|---|
| 5,384,745 | A | * | 1/1995 | Konishi et al. | 365/230.03 |
| 5,426,606 | A | * | 6/1995 | Takai | 365/189.05 |
| 6,279,116 | B1 | * | 8/2001 | Lee | 713/601 |
| 6,351,432 | B1 | * | 2/2002 | Higashiho et al. | 365/230.08 |

FOREIGN PATENT DOCUMENTS

KR 1998-45800 9/1998

* cited by examiner

*Primary Examiner*—J. H. Hur
(74) *Attorney, Agent, or Firm*—Marshall, Gerstein & Borun LLP (57) ABSTRACT

The present invention relates to a structure and method for transferring a column address. In transferring an external column address to the inside of a memory cell, a latch control unit controls the operation of a latch unit for latching the external column address signal. It is thus possible to prohibit consumption of current by controlling the operation of the latch unit when a read or write command signal is inputted.

11 Claims, 5 Drawing Sheets

STRUCTURE AND METHOD FOR TRANSFERRING COLUMN ADDRESS

BACKGROUND

1. Field of the Invention

The present invention relates to a structure and method for transferring a column address and, more specifically, to a structure and method for transferring a column address in a semiconductor device, which can prohibit consumption of current by controlling the column address of a DRAM device.

2. Discussion of Related Art

A column address in an exiting SDRAM or DDR SDRAM is a type that operates every clock. As there is an interrupt operation internally, the column address was made to inevitably operate every clock.

Figure 1:
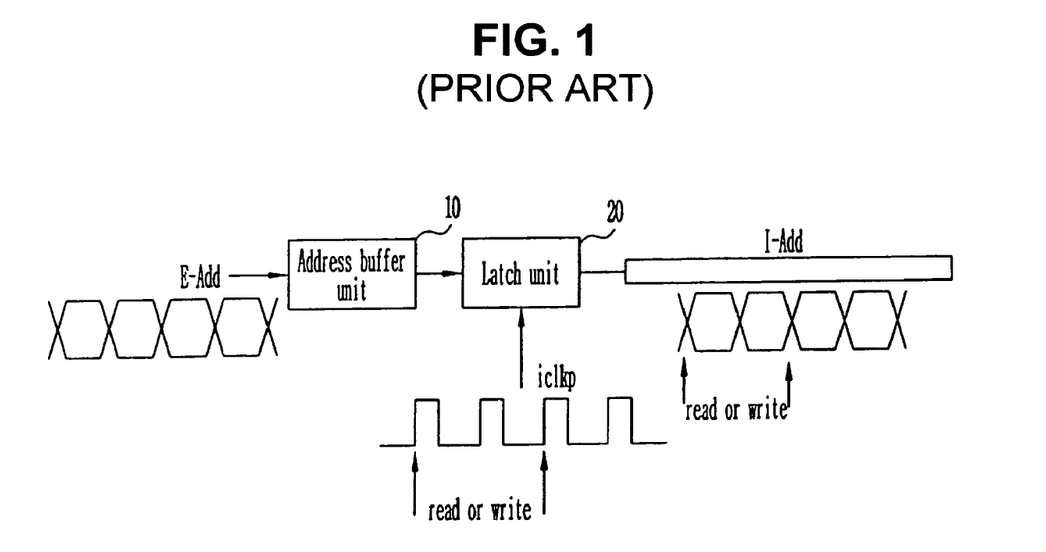
FIG. 1 is a block diagram illustrating a conventional method of transferring a column address.

FIG. 1 is a block diagram illustrating a conventional method of transferring the column address.

Referring to FIG. 1, an external address signal (E_Add) passes through an address buffer unit 10 and a latch unit 20. The address decoded in a column address decoder is transmitted to a memory cell. The address buffer unit 10 buffers the external address signal (E_Add) and the latch unit 20 is operated by a clock signal (iclkp) to latch the output of the address buffer unit 10. The latch unit 20 is synchronized to a clock pulse (iclkp) generated in a clock means in latching an effective address to receive the external address signal (E_Add) every clock. Therefore, as the latch unit 20 consumes current every clock, there is a problem that consumption of current due to the input of an unnecessary clock signal takes place.

For example, in a read or write operation of a burst length 4 operation, the interrupt operation is not allowed. This means that the external address signal (E_Add) is not needed to be applied to the inside in a next clock after the read or write command is applied. As described above, however, as the clock signal is applied to the latch unit in the prior art, unnecessary consumption of current due to this occurs.

SUMMARY OF THE INVENTION

The present invention is directed to provide a structure and a method for transferring a column address, which can prohibit consumption of current by controlling the operation of a latch unit when a read or write command is inputted, in such a manner that a latch control unit capable of controlling the operation of the latch unit is positioned in an address input terminal.

According to a preferred embodiment of the present invention, there is provided a structure for transferring a column address comprising: an address buffer unit for buffering an external column address; a latch control unit for converting the period of a clock signal according to a read/write command signal to generate a control signal; and a latch unit for converting the buffered column address into an internal address according to the control signal.

In the aforementioned of a structure for transferring a column address according to another embodiment of the present invention, the latch control unit comprises: a signal generator for generating a clock control signal, wherein the clock control signal becomes a logical High state if the read/write command signal is not applied, and becomes a logical Low state from the falling edge of the clock signal applied along with the read/write command signal to the falling edge of a next clock signal if the read/write command signal is applied; and an output unit for outputting the control signal of the logical High state when both the clock control signal and the clock signal are at the logical High state.

In the aforementioned of a structure for transferring a column address according to another embodiment of the present invention, the signal generator comprises: a first NAND gate having one of input terminals connected to the clock signal and the other of the input terminals connected to a first signal, wherein the first NAND gate performs a NAND operation for the clock signal and the first signal; a first PMOS transistor and a second PMOS transistor both serially connected between a power supply voltage and a first node, wherein the first PMOS transistor is driven by the output signal of the first NAND gate and the second PMOS transistor is driven by the read/write command signal; a NMOS transistor connected between the first node and a ground voltage and driven by the read/write command signal; a third PMOS transistor connected between the power supply voltage and the first node and driven by a power-up signal; a first latch, a transfer gate driven by the clock signal, a second latch and a second inverter, which are serially connected between the first node and a second node to which the first signal is applied; a third inverter connected between the clock signal and a control terminal of the transfer gate, for inverting the clock signal; and a fourth inverter connected between the second node and the clock control signal output terminal, for inverting the signal of the second node.

In the aforementioned of a structure for transferring a column address according to another embodiment of the present invention, the output unit comprises: a second NAND gate having one of input terminals connected to the clock control signal and the other of the input terminals connected to the clock signal, wherein the second NAND gate performs a NAND operation for the clock control signal and the clock signal; and an fifth inverter connected between the output terminal of the second NAND gate and the output terminal of the output unit, for inverting the output of the second NAND gate.

One aspect of the present invention is to provide a method for transferring a column address comprising the steps of: buffering an external column address; converting the period of a clock signal according to a read/write command signal to generate a control signal; and converting the buffered column address into an internal address according to the control signal, and latching the internal address.

In the aforementioned a method for transferring a column address of according to another embodiment of the present invention, the step of converting the period of the clock signal to generate the control signal comprises the steps of: generating a clock control signal, wherein the clock control signal becomes a logical High state if the read/write command signal is not applied, and becomes a logical Low state from the falling edge of the clock signal applied along with the read/write command signal to the falling edge of a next clock signal if the read/write command signal is applied; and outputting the control signal of the logical High state when both the clock control signal and the clock signal are at the logical High state.

DETAILED DESCRIPTION OF PREFERRED EMBODIMENTS

Now the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later.

The present invention can reduce consumption of current by controlling a column address in a next clock of a read or write command. An operation for reading or writing data is performed until a clock, after a read or write command signal is applied. In the next clock after the read or write command is applied, it is not necessary for an external address to be applied to the inside. In the present invention, therefore, a control means capable of controlling the operation of the latch unit is positioned. If the read or write command is not applied, the control mans controls the operation of the latch unit using the clock signal as the control signal. If the read or write command is applied, the control means controls the operation of the latch unit using the control signal that becomes a logical Low for one cycle of a next clock after the read or write command is applied. Accordingly, it is possible to reduce consumption of current/power occurring due to the input of unnecessary clock.

Preferably, the latch unit after the read/write command signal is made not to operate, by using that CAS to CAS delay time (tCCD) being a delay between the column address and the column address, being one of characteristics of DDR2 SDRAM, is 2 clocks and an interrupt prohibit rule at the burst length 4 being DDR2 characteristic to remove the input of the clock signal of one cycle after the read/write command signal, thereby controlling the column address after the read/write command signal.

Figure 2A:
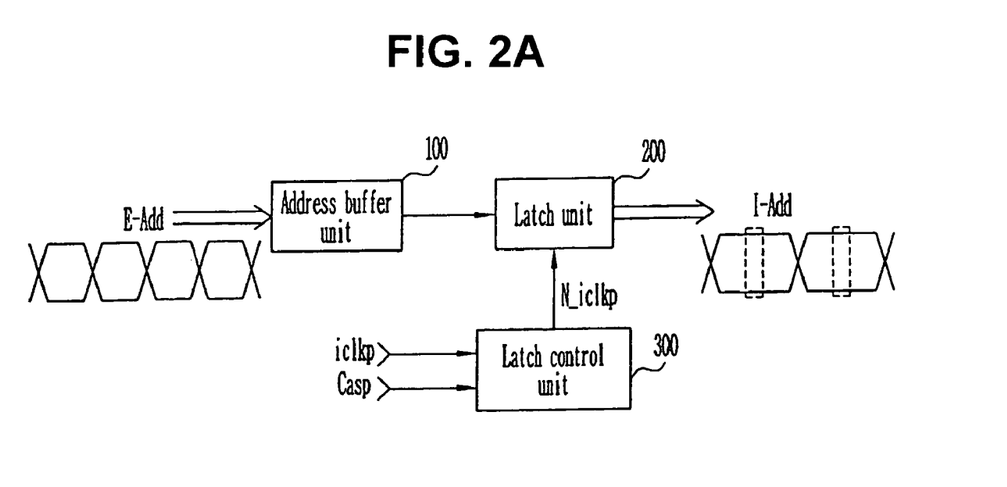
FIG. 2A is a block diagram shown to explain a method of transferring a column address according to the present invention.
Figure 2B:
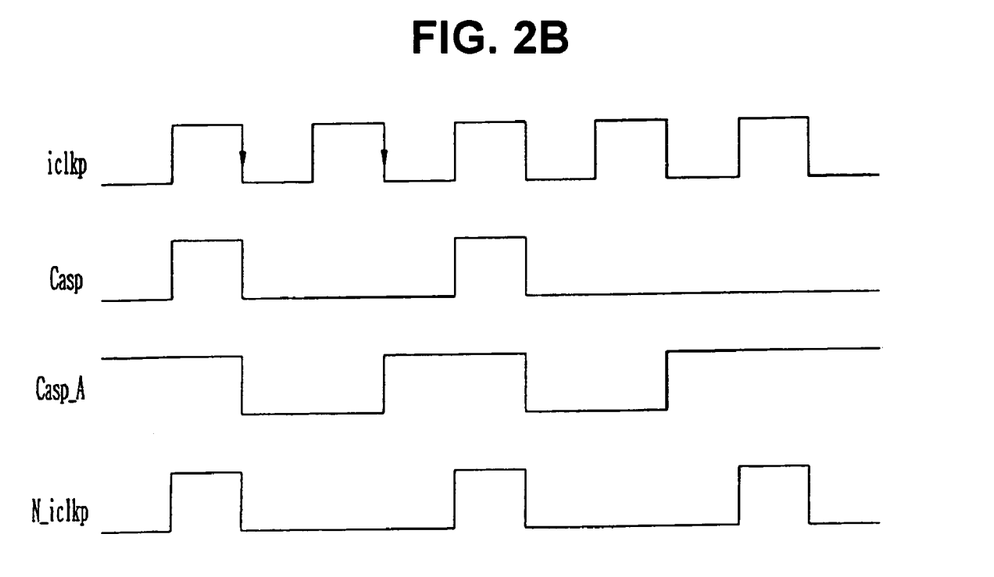
FIG. 2B is waveforms inputted to respective blocks.

FIG. 2A is a block diagram shown to explain a method of transferring a column address according to the present invention, and FIG. 2B is waveforms inputted to respective blocks.

Referring to FIGS. 2A and 2B, the address transfer structure of the present invention includes an address buffer unit 100 for buffering an external column address (E_Add), a latch control unit 300 for outputting a control signal (N_iclkp) depending on an external read/write command signal (Casp) and a clock signal (iclkp), and a latch unit 200 operated by the control signal (N_iclkp), for converting a buffered external column address (E_Add) into an internal address (I_Add) and then latching it.

The external command signal is a read/write command signal. The latch control unit 300 of the present invention outputs the clock signal (iclkp) of FIG. 2B as the control signal (N_iclkp) if the external read/write command signal (Casp) is not applied, and outputs the control signal (N_iclkp) from which the clock signal of one cycle next to the read/write command signal (Casp) is removed if the read/write command signal (Casp) is applied, as shown in FIG. 2B. The latch unit 200 is operated by the control signal (N_iclkp) and converts/latches the external column address (E_Add) to transmit it to the inside of a cell. The clock signal (iclkp) may be used as an internal clock used in the inside of the memory cell.

Thereby, during the time when the input of the external address is not necessary due to application of the read/write command signal (Casp), the control signal (N_iclkp) controls the operation of the latch unit 200 that converts/latches the external address (E_Add), thus preventing consumption of current caused by the latch unit 200.

The mentioned latch control unit will now be described in more detail.

Figure 3:
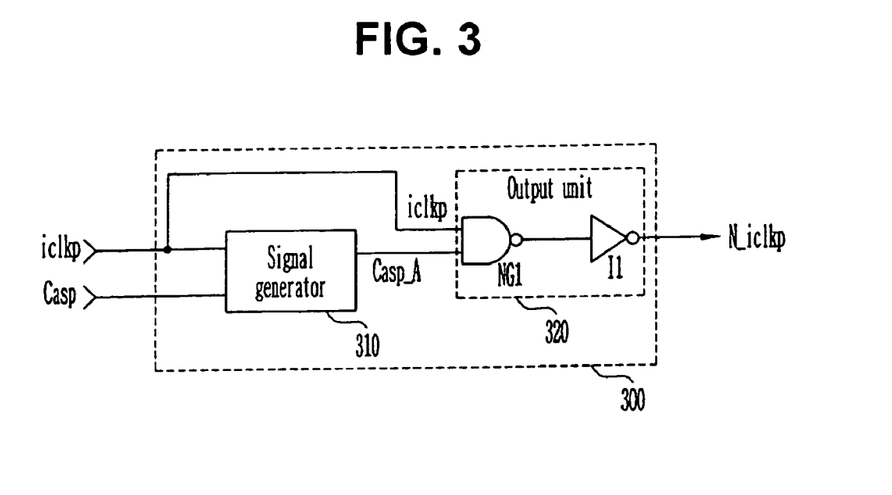
FIG. 3 is a block diagram illustrating a latch control unit according to the present invention.

FIG. 3 is a block diagram illustrating the latch control unit according to the present invention.

Referring to FIG. 3, the latch control unit 300 includes a signal generator 310 for using the read/write command signal (Casp) and the clock signal (iclkp) to output a clock control signal (Casp_A), and an output unit 320 for logically combining the clock signal (iclkp) and the clock control signal (Casp_A) to output a control signal (N_iclkp). The logical combination indicates an ANDing combination between the clock control signal (Casp_A) and the clock signal (iclkp).

One of input terminals of the signal generator 310 is connected to the read/write command signal (Casp) input terminal, the other of the input terminals thereof is connected to the clock signal (iclkp) input terminal, and an output terminal thereof is connected to one of input terminals (clock control signal (Casp_A) output terminal) of the output unit.

The output unit 320 includes a first NAND gate NG1 and a first inverter I1. One of input terminals of the first NAND gate NG1 is connected to the clock control signal (Casp_A) output terminal of the signal generator 310 and the other of the input terminals thereof is connected to the clock signal (iclkp) input terminal, and an output terminal thereof is connected to an input terminal of the first inverter I1. An output terminal of the first inverter I1 is connected to the control signal (N_iclkp) output terminal.

The operation of the latch control unit will now be described with reference to the waveform of FIG. 2B and the block diagram of FIG. 3.

The signal generator 310 outputs the clock control signal (Casp_A) being a logical High if the read/write command signal (Casp) is not applied thereto. Meanwhile, if the read/write command signal (Casp) is inputted, the signal generator 310 outputs the clock control signal (Casp_A) being a logical Low from the falling edge of the clock signal (iclkp) applied along with the read/write command signal (Casp) to the falling edge of a next clock signal (during one period). What the read/write command signal (Casp) is applied means that the read/write command signal (Casp) becomes a logical High from an external command control unit (not shown).

The output unit 320 uses the first NAND gate NG1 to perform a NAND operation for the clock control signal (Casp_A) and the clock signal (iclkp) through and then uses the first inverter I1 to invert the result of the two signals, thus outputting the control signal (N_iclkp). If the clock control signal (Casp_A) is a logical High through the output unit 320, the clock signal (iclkp) is outputted as the control signal (N_iclkp) by means of the first NAND gate NG1 and the first inverter I1. If the clock control signal (Casp_A) is a logical Low, a signal of the logical Low is outputted as the control signal (N_iclkp) by means of the first NAND gate NG1 and the first inverter I1.

The signal generator will now be described in detail.

Figure 4A:
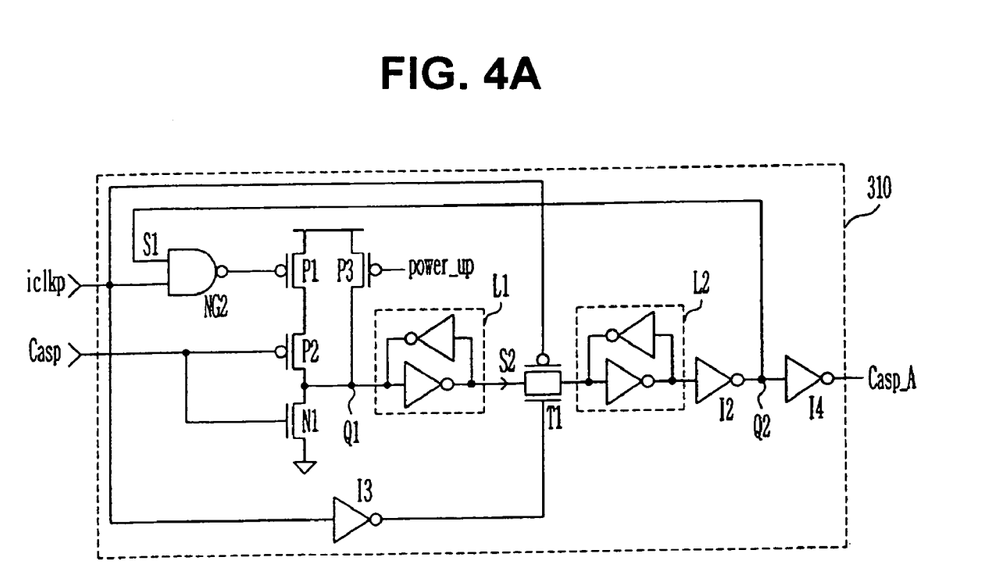
FIG. 4A is a circuit diagram illustrating a signal generator according to the present invention and FIG. 4B is a waveform of the signal generator circuit.
Figure 4B:
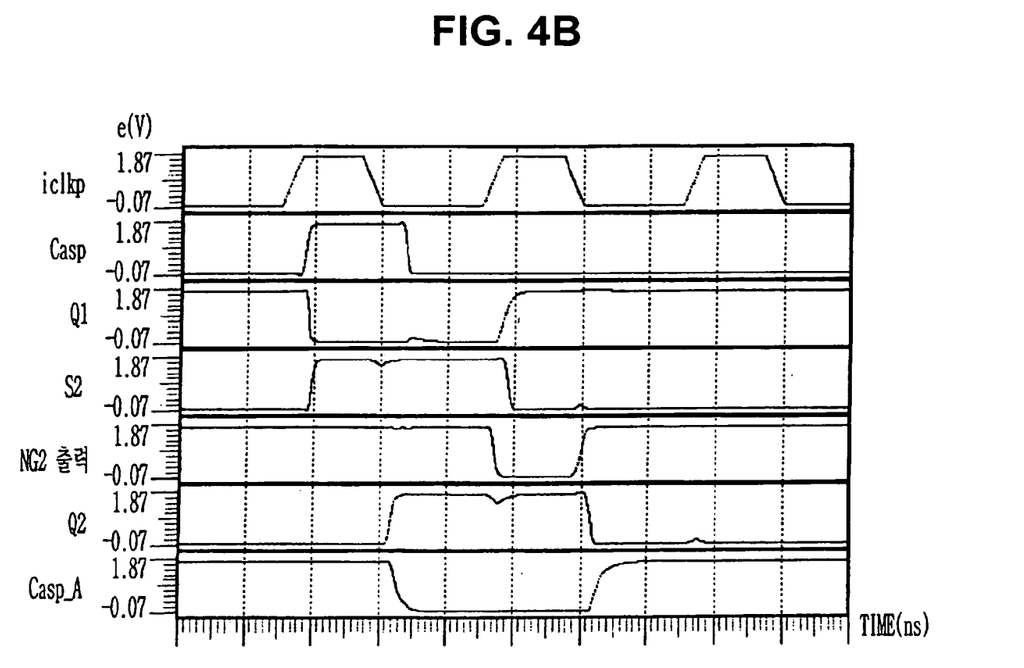

FIG. 4A is a circuit diagram illustrating the signal generator according to the present invention and FIG. 4B is a waveform of the signal generator circuit.

Referring to FIG. 4A, the signal generator 310 of the present invention includes a second NAND gate NG2, first to third PMOS transistors P1 to P3, a first NMOS transistor N1, first and second latches L1 and L2, a first transfer gate T1, and second to fourth inverters I2 to I4.

One of input terminals of the second NAND gate NG2 is connected to the clock signal (iclkp) input terminal, the other of the input terminals thereof is connected to a second node Q2 and an output terminal thereof is connected to a gate terminal of the first PMOS transistor P1. The first and second PMOS transistors P1 and P2 are connected serially between the power supply voltage (Vcc) and a first node Q1. The first PMOS transistor P1 is driven by the output of the second NAND gate NG2 and the second PMOS transistor P2 is driven by the read/write command signal (Casp). The first NMOS transistor N1 is connected between the first node Q1 and the ground voltage (Vss) and is driven by the read/write command signal (Casp). A third PMOS transistor P3 is connected between the power supply voltage (Vcc) and the first node Q1 and is driven by a power-up signal (Power_up). The first and second PMOS transistors P1 and P2 that are connected serially and the third PMOS transistor P3 are in parallel connected to the power supply voltage (Vcc) and the first node Q1. A first latch L1, a first transfer gate T1, a second latch L2 and a second inverter I2 are sequentially connected serially between the first node Q1 and the second node Q2. A third inverter I3 is connected between the clock signal (iclkp) input terminal and a gate terminal (one control terminal) of the NMOS transistor of the first transfer gate T1. The gate terminal (the other control terminal) of the PMOS transistor of the first transfer gate T1 is driven by the clock signal (iclkp) and the NMOS transistor is driven by the clock signal being an inversion of the output of the third inverter I3. In each of the first and second latches L1 and L2, two inverters are in parallel connected. An input terminal of one inverter is connected to an output terminal of the other inverter. A fourth inverter I4 is connected to the second node Q2 and the clock control signal (Casp_A) output terminal.

The operation of the signal generator constructed above will be described with reference to waveform.

Referring to FIG. 4A and FIG. 4B, if an initial power-up signal (Power_up) is applied, the third PMOS transistor P3 is driven to apply the power supply voltage (logical High state) to the first node Q1. Therefore, if the read/write command signal (Casp) is not applied (logical Low), a first signal (S1) of a logical Low is applied to the second node Q2 by means of the first latch L1, the first transfer gate T1, the second latch L1 an the second inverter I2. The fourth inverter I4 inverts a first signal (S2) of a logical Low to output the clock control signal (Casp_A) of a logical High. At this time, the first transfer gate T1 is driven only when the clock signal (iclkp) is at a logical Low, to transfer the output of the first latch L1 to the second latch L2. The output of the second NAND gate NG2 becomes a logical High by means of the first signal (S1) being the logical Low of the second node Q2. For this reason, the first PMOS transistor P1 is turned off.

At this time, if the clock signal (iclkp) firstly shifts from the logical Low to the logical High (logical High state) and the read/write command signal (Casp) is applied at the same time (logical High), the first NMOS transistor N1 is turned on to apply the ground voltage (logical Low state) to the first node Q1. The logical Low signal of the first node Q1 is latched by the first latch L1 to transfer the second signal (S2) being a logical High to the first transfer gate T1.

If the clock signal (iclkp) secondly shifts from the logical High to the logical Low (logical Low state), the first transfer gate T1 is turned on to transfer the second signal (S2) being the logical High that is latched by the first latch L1 to the second latch L2. The second signal (S2) of a logical High being the output of the first latch L1 is latched to be a logical Low by means of the second latch L2. The logical Low signal that was latched by the second latch L2 is inverted by the second inverter I2, so that the first signal (S1) of the logical High is applied to the second node Q2. The first signal (S1) being the logical High that was applied to the second node Q2 is inverted by the fourth inverter I4, so that the clock control signal (Casp_A) being the logical Low is outputted.

The first PMOS transistor P1 is turned on/off by the clock signal (iclkp) that is transmitted to the second NAND gate NG2 by the first signal (S1) being the logical High of the second node Q2. As the clock signal (iclkp) at the moment when the first signal (S1) of the logical High is transmitted to the second NAND gate NG2 is kept logically Low, the output of the second NAND gate NG2 is kept logically High to turn off the first PMOS transistor P1.

Meanwhile, if the read/write command signal (Casp) becomes a logical Low state, the first and second latches L1 and L2 maintain respective latch signals and the second PMOS transistor P2 is turned on.

If the clock signal (iclkp) thirdly shifts from the logical Low to the logical High (logical High state), a signal of the logical Low is applied to the gate terminal of the first PMOS transistor P1 by means of the second NAND gate NG2. The first PMOS transistor P1 is thus turned on. The power supply voltage (logical High state) is applied to the first node Q1 by means of the turned-on first PMOS transistor P1 and the second PMOS transistor P2. The logical High signal applied to the first node Q1 is latched by the first latch L1 to transmit the second signal (S2) being the logical Low to the first transfer gate T1. At this time, the second latch L2 continues to keep logically High.

At this time, if the clock signal (iclkp) fourthly shifts from the logical High to the logical Low (logical Low state), the first transfer gate T1 is turned on. Thus, the second signal (S2) being the logical Low that was latched by the first latch L1 is latched to be a logical High by means of the second latch L2. The logical High signal that was latched by the second latch L2 is inverted by the second inverter I2, so that the first signal (S1) being the logical Low is transmitted to the second node Q2. The first signal (S1) being the logical Low that was applied to the second node Q2 is inverted by the fourth inverter I4, so that the clock control signal (Casp_A) of a logical High is outputted. At this time, the second NAND gate NG2 outputs only the logical High signal regardless of the clock signal by means of the first signal (S1) being the logical Low of the second node Q2, thus turning off the first PMOS transistor P1.

As described above, the signal generator 310 outputs the clock control signal (Casp_A) being a logical Low from the falling edge of the clock signal where the read/write command signal (Casp) is inputted to the falling edge of a next clock signal, if the clock signal (iclkp) and the read/write command signal (Casp) of the logical High are inputted.

Therefore, the operation of the latch control unit 300 of the present invention can be explained again based on the input signals. If the read/write command signal (Casp) is not applied, the signal generator 310 outputs the clock control signal (Casp_A) of a logical High.

The clock signal that is inverted by the first NAND gate NG1 for receiving the clock control signal (Casp_A) and the clock signal (iclkp) of a logical High state is outputted. The inverted clock signal is again inverted by the first inverter I1, so that the original clock signal is outputted to the latch unit 200 as the control signal (N_iclkp) being the output of the latch control unit 300. Meanwhile, if the read/write command signal (Casp) is applied upon the clock signal (iclkp) of the logical High, the signal generator 310 outputs the clock control signal (Casp_A) of a logical Low state from the falling edge of the clock signal being a logical High to the falling edge of a next clock signal. A logical High signal is outputted by the first NAND gate NG1 that received the clock control signal (Casp_A) and the clock signal (iclkp) of a logical Low state. The output of the first NAND gate NG1 is inverted by the first inverter I1, so that the logical Low signal is outputted to the latch unit 200 as the control signal (N_iclkp) being the output of the latch control unit 300.

Figure 5:
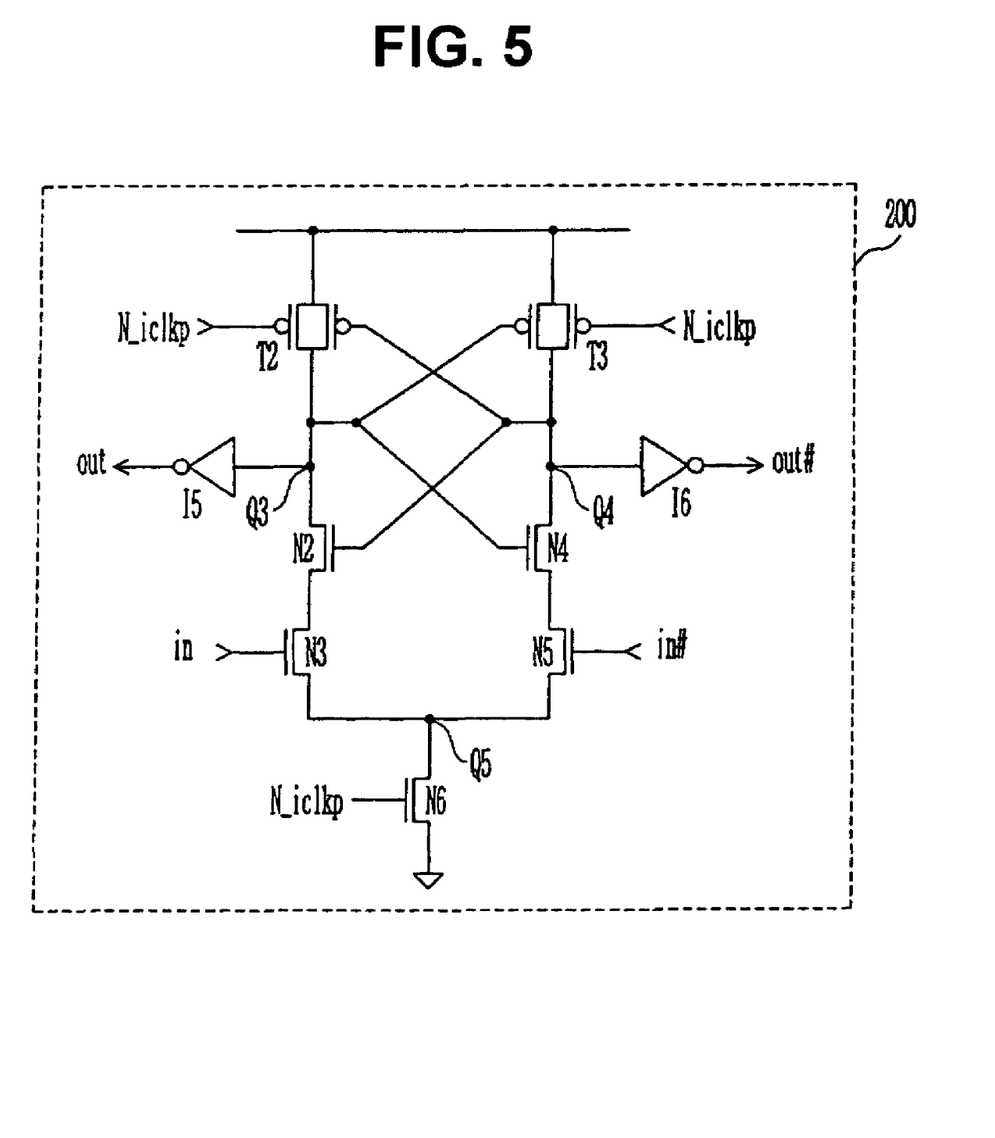
FIG. 5 is a circuit diagram illustrating a latch unit according to the present invention.

FIG. 5 is a circuit diagram illustrating the latch unit according to the present invention.

Referring to FIG. 5, the latch unit 200 includes second and third transfer gates T2 and T3 having two PMOS transistors, second to sixth NMOS transistors N2 to N6, and fifth and sixth inverters I5 and I6.

The second transfer gate T2 is connected between the power supply voltage (Vcc) and a third node Q3 and is driven by the output (the control signal) of a fourth node Q4 and the latch control unit 300. The second and third NMOS transistors N2 and N3 are connected serially between the third node Q3 and a fifth node Q5 and are each driven by the output signal of the fourth node Q4 and the address buffer unit 100. The third transfer gate T3 is connected between the power supply voltage (Vcc) and the fourth node Q4 and driven by the output (the control signal) of the third node Q3 and the latch control unit 300. The fourth and fifth NMOS transistors N4 and N5 are connected serially between the fourth node Q4 and a fifth node Q5 and are each driven by the inverted output signal of the third node Q3 and the address buffer unit. The sixth NMOS transistor N6 is connected between the fifth node Q5 and the ground voltage (Vcc) and driven by the output (the control signal (N_iclkp) of the latch control unit 300. The fifth inverter I5 is connected between the third node Q3 and one of output terminals of the latch unit 200 and inverts the signal of the third node Q3. The sixth inverter I6 is connected between the fourth node Q4 and the other of the output terminals of the latch unit 200 and inverts the signal of the fourth node Q4.

The operation of the latch unit constructed above will now be described.

If the external control signal (N_iclkp) becomes a logical Low, the second and third transfer gates T2 and T3 are turned on and the sixth NMOS transistor N6 is turned off, so that the output of the latch unit 200, having only a logical Low, is outputted. Further, if the control signal (N_iclkp) being a logical High is applied, the sixth NMOS transistor N6 is turned on, logical states of the third and fourth nodes Q3 and Q4 are changed by the inputted signal (output signal of the address buffer unit 100), and the operation of the second and fourth NMOS transistors N2 and N4 and the second and third transfer gates T2 and T3 are controlled by the logical state of the third and fourth nodes Q3 and Q4. If the control signal (N_iclkp) of a logical High is inputted, the logical state of the output of the latch unit 200 is changed by the output signal of the address buffer unit 100. As such, the latch unit 200 is controlled by the control signal (N_iclkp) being the output of the latch control unit 300.

According to the present invention, in transferring an external column address to the inside of a memory cell, a latch control unit controls the operation of a latch unit for latching the external column address signal. It is thus possible to prohibit consumption of current by controlling the operation of the latch unit when a read or write command signal is inputted.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A structure for transferring a column address comprising:
   an address buffer unit for buffering an external column address;
   a signal generator for generating a clock control signal by converting a clock signal in response to the read/write command signal;
   an output unit for generating a control signal using the clock signal when the signal generator generates the clock control signal of a first level; and
   a latch unit for converting the buffered column address into an internal address according to the control signal.

2. The structure for transferring a column address as claimed in claim 1, wherein
   the signal generator generates the clock control signal of a second level, from the falling edge of the clock signal applied along with the read/write command signal to the falling edge of a next clock signal if the read/write command signal is applied.

3. The structure for transferring a column address as claimed in claim 2, wherein the signal generator comprises:
   a first NAND gate having one of input terminals connected to the clock signal and the other of the input terminals connected to a first signal, wherein the first NAND gate performs a NAND operation for the clock signal and the first signal;
   a first PMOS transistor and a second PMOS transistor both serially connected between a power supply voltage and a first node, wherein the first PMOS transistor is driven by the output signal of the first NAND gate and the second PMOS transistor is driven by the read/write command signal;
   an NMOS transistor connected between the first node and a ground voltage, and driven by the read/write command signal;
   a third PMOS transistor connected between the power supply voltage and the first node, and driven by a power-up signal;
   a first latch, a transfer gate driven by the clock signal, a second latch and a second inverter, which are serially connected between the first node and a second node to which the first signal is applied;
   a third inverter connected between the clock signal and a control terminal of the transfer gate, for inverting the clock signal; and
   a fourth inverter connected between the second node and the clock control signal output terminal, for inverting the signal of the second node.

4. The structure for transferring a column address as claimed in claim 1, wherein the output unit comprises:

a second NAND gate having one of input terminals connected to the clock control signal and the other of the input terminals connected to the clock signal, wherein the second NAND gate performs a NAND operation for the clock control signal and the clock signal; and an fifth inverter connected between the output terminal of the second NAND gate and the output terminal of the output unit, for inverting the output of the second NAND gate.

5. The structure for transferring a column address as claimed in claim 1, wherein the signal generator generates the clock control signal of a second level for a predetermined cycles of the clock signal if the read/write command signal is applied.

6. A method for transferring a column address comprising the steps of:
  (a) buffering an external column address;
  (b) outputting a clock signal as a control signal if a read/write command signal is not applied, and outputting the control signal from which the clock signal of one cycle next to the read/write command signal is removed if the read/write command signal is applied; and
  (c) converting the buffered column address into an internal address according to the control signal, and latching the internal address.

7. The method for transferring a column address as claimed in claim 6, wherein the (b) step comprises the steps of:
  generating a clock control signal, wherein the clock control signal becomes a logical High state if the read/write command signal is not applied, and becomes a logical Low state from the falling edge of the clock signal applied along with the read/write command signal to the falling edge of a next clock signal if the read/write command signal is applied; and
  outputting the control signal of the logical High state when both the clock control signal and the clock signal are at the logical High state.

8. A structure for transferring a column address comprising:
  an address buffer unit for buffering an external column address;
  a latch control unit for outputting a clock signal as a control signal if a read/write command signal is not applied, and outputting the control signal from which the clock signal of one cycle next to the read/write command signal is removed if the read/write command signal is applied; and
  a latch unit for converting the buffered column address into an internal address according to the control signal.

9. The structure for transferring a column address as claimed in claim 8, wherein the latch control unit comprises:
  a signal generator for generating a clock control signal, wherein the clock control signal becomes a logical High state if the read/write command signal is not applied, and becomes a logical Low state from the falling edge of the clock signal applied along with the read/write command signal to the falling edge of a next clock signal if the read/write command signal is applied; and
  an output unit for outputting the control signal of the logical High state when both the clock control signal and the clock signal are at the logical High state.

10. The structure for transferring a column address as claimed in claim 9, wherein the signal generator comprises:
  a first NAND gate having one of input terminals connected to the clock signal and the other of the input terminals connected to a first signal, wherein the first NAND gate performs a NAND operation for the clock signal and the first signal;
  a first PMOS transistor and a second PMOS transistor both serially connected between a power supply voltage and a first node, wherein the first PMOS transistor is driven by the output signal of the first NAND gate and the second PMOS transistor is driven by the read/write command signal;
  a NMOS transistor connected between the first node and a ground voltage, and driven by the read/write command signal;
  a third PMOS transistor connected between the power supply voltage and the first node, and driven by a power-up signal;
  a first latch, a transfer gate driven by the clock signal, a second latch and a second inverter, which are serially connected between the first node and a second node to which the first signal is applied;
  a third inverter connected between the clock signal and a control terminal of the transfer gate, for inverting the clock signal; and
  a fourth inverter connected between the second node and the clock control signal output terminal, for inverting the signal of the second node.

11. The structure for transferring a column address as claimed in claim 9, wherein the output unit comprises:
  a second NAND gate having one of input terminals connected to the clock control signal and the other of the input terminals connected to the clock signal, wherein the second NAND gate performs a NAND operation for the clock control signal and the clock signal; and
  an fifth inverter connected between the output terminal of the second NAND gate and the output terminal of the output unit, for inverting the output of the second NAND gate.

* * * * *